United States Patent
Tamura

(10) Patent No.: US 6,576,400 B1
(45) Date of Patent: Jun. 10, 2003

(54) POSITIVE-WORKING RADIATION-SENSITIVE COMPOSITION AND PROCESS FOR FORMING A PATTERN

(75) Inventor: Kazutaka Tamura, Shiga (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 09/567,432

(22) Filed: May 10, 2000

Related U.S. Application Data

(63) Continuation of application No. PCT/JP99/04850, filed on Jul. 9, 1999.

(30) Foreign Application Priority Data

Sep. 10, 1998 (JP) .......................................... 98-256937

(51) Int. Cl.$^7$ .............................. G03C 5/16; G03F 7/30
(52) U.S. Cl. .................. 430/296; 430/270.1; 430/325; 430/326; 430/910; 430/942; 430/966
(58) Field of Search .............................. 430/270.1, 910, 430/325, 326, 942, 296

(56) References Cited

U.S. PATENT DOCUMENTS

| | | | |
|---|---|---|---|
| 4,061,829 A | * 12/1977 | Taylor | 428/451 |
| 4,259,407 A | * 3/1981 | Tada et al. | 428/421 |
| 4,268,607 A | * 5/1981 | Tada | 430/270.1 |
| 5,932,391 A | * 8/1999 | Ushirogouchi et al. | 430/270.1 |
| 6,004,720 A | * 12/1999 | Takechi et al. | 430/270.1 |
| 6,060,207 A | * 5/2000 | Shida et al. | 430/176 |
| 6,071,670 A | * 6/2000 | Ushirogouchi et al. | 430/270.1 |
| 6,344,304 B1 | * 2/2002 | Takechi et al. | 430/270.1 |

* cited by examiner

Primary Examiner—John S. Chu

(57) ABSTRACT

The present invention relates to a positive-working radiation-sensitive composition which is characterized in that it is a positive-working radiation-sensitive composition containing polymer the solubility of which is increased in aqueous alkali by the action of acid, and a compound which generates acid by irradiation with radiation, and the ease of occurrence of main chain scission of said polymer by means of radiation is greater than that of polymethyl methacrylate, and it also relates to a positive-working radiation-sensitive composition which is characterized in that it contains an alkali-soluble polymer, a compound having the effect of suppressing the alkali-solubility of said alkali-soluble polymer and the suppression effect of which is lowered or eliminated by the action of acid, and a compound which generates acid by irradiation with radiation, and the ease of occurrence of main chain scission of said alkali-soluble polymer by radiation is greater than that of polymethyl methacrylate.

By means of the present invention it is possible to obtain a high sensitivity positive-working radiation-sensitive composition of resolution which makes possible sub quarter micron pattern processing.

13 Claims, No Drawings

POSITIVE-WORKING RADIATION-SENSITIVE COMPOSITION AND PROCESS FOR FORMING A PATTERN

REFERENCE TO RELATED APPLICATION

This application is a continuation of International Application No. PCT/JP99/04850, filed Jul. 9, 1999.

TECHNICAL FIELD

The present invention relates to a positive-working radiation-sensitive composition which is used to produce semiconductor integrated circuits, masks for lithography and the like.

FIELD OF INVENTION

In recent years, in fields such as the production of semiconductor circuits and masks for lithography, in order to achieve ever finer patterns as densities of circuits are increased, still higher degrees of resolution have been demanded of the resist materials, and it has become necessary to be able to carry out sub-quarter micron (<0.25 $\mu$m) pattern processing at high sensitivity. With lithography of the kind carried out hitherto which employs radiation sources of comparatively long wavelength, such fine processing is difficult, and so lithography employing still shorter wavelength deep ultraviolet, X-rays or electron beams is being investigated, and resists suitable for such radiation sources are being demanded.

Recently, as known resist materials with the high sensitivity and high resolution for such radiation sources, chemically-amplified resists have been actively investigated. Chemically-amplified resists are resists employing a mechanism whereby an acid is generated in the exposed regions by the action of a photoacid generator and, by the catalytic action of this acid, the solubility of the exposed regions is altered. Amongst such chemically-amplified resists, as resin components for showing comparatively good resist properties there are already known resists employing resins where the groups with alkali affinity in an alkali-soluble resin are protected by a t-butyl ester group or t-butoxycarbonyl group (JP-B-2-27660), resins where protection is carried out in the same way with silyl groups (JP-B-3-44290), resins where protection is carried out in the same way with ketal groups (JP-A-7-140666), resins where protection is carried out in the same way with acetal groups (JP-A-2-161436 and JP-A-5-249682), and resins containing a (meth)acrylic acid component (JP-A-4-39665), etc. However, resolution and sensitivity have a mutually conflicting relationship, and there has been the disadvantage that, in obtaining the resolution to carry out sub-quarter micron pattern processing, the sensitivity is inadequate.

SUMMARY OF THE INVENTION

This invention relates to a positive-working radiation-sensitive composition which is characterized in that it is a positive-working radiation-sensitive composition containing (1) polymer A, the solubility of which in aqueous alkali solution is increased by the action of acid (hereinafter referred to as polymer A), and/or (2) alkali-soluble polymer B (hereinafter referred to as polymer B) and a compound which has the effect of suppressing the alkali solubility of said polymer and the suppression effect of which is lowered or eliminated by the action of acid (hereinafter referred to as dissolution inhibitor C), and (3) a compound which generates acid by irradiation with radiation, and the ease of occurrence of main chain scission of said polymer A and/or B by means of radiation is greater than that of polymethyl methacrylate.

DETAILED DESCRIPTION OF THE INVENTION

It has been discovered that, by means of the positive-working radiation-sensitive composition of the present invention which employs polymer where main chain scission readily occurs as a result of irradiation with radiation, there is obtained a synergistic effect between the chemical amplification mechanism and the main chain scission mechanism, and high resolution and high sensitivity can be realized. Below, the details are explained.

Polymer A employed in the positive-working radiation-sensitive composition of the present invention is a polymer which is normally insoluble or sparingly soluble in aqueous alkali solution, but by the action of acid its solubility in aqueous alkali solution is increased and it becomes soluble. Polymer B is a polymer which is soluble in aqueous alkali solution but, by the addition of dissolution inhibitor C, its solubility in aqueous alkali solution is reduced and, normally, it is insoluble or sparingly soluble. In addition to such solubility characteristics in terms of aqueous alkali solution, polymer A and B possess the characteristic that the ease of occurrence of main chain scission by means of radiation is greater than that of polymethyl methacrylate. Furthermore, polymer of main chain scission efficiency value Gs at least 2.5 is more favourably employed. More preferably, the Gs value is at least 3.0 and no more than 50. If the Gs value is less than 2.5, then adequate sensitivity and resolution are not obtained, while if the Gs value is greater than 50 the polymer stability is no longer adequate.

The Gs value expresses the number of main chain scissions per 100 eV irradiation energy of an electron beam of acceleration voltage 20 kV, and the following relation is established between the molecular weight of the polymer before and after irradiation.

$$1/Mn^* = 20{,}000 GsD/100 eN_A + 1/Mn$$

Here, D is the exposure dose (C/g) per 1 g of polymer; e is the charge on an electron; $N_A$ is Avogadro's number; $Mn^*$ is the number average molecular weight following exposure, as determined by GPC; and Mn is the number average molecular weight before exposure, as determined by GPC. From this formula, if $1/Mn^*$, which is the reciprocal of the molecular weight of the polymer following exposure as determined by GPC, is plotted against the exposure dose D, it is clear that the slope is $200 Gs/eN_A$, and so Gs can be calculated.

Polymer B employed in the present invention contains acidic functional groups which ordinarily manifest alkali solubility. As the acidic functional groups, there may be used phenolic hydroxyl groups, carboxyl groups, sulphoxy groups or the like. Polymer containing monomer units represented by general formula (1) may be cited as a particularly suitable example of polymer B (hereinafter these monomer units are simply referred to as monomer units B).

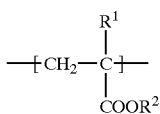
(1)

Here, $R^1$ represents a halogen atom or cyano group, and $R^2$ represents a hydrogen atom or a $C_2$ to $C_{12}$ organic group with an acidic functional group. As specific examples of the halogen atom represented by $R^1$, there are the fluorine atom, chlorine atom and bromine atom. As specific examples of the organic group with an.acidic functional group, represented by $R^2$, there are the carboxylmethyl group, p-hydroxyphenyl group, p-carboxyphenyl group and the like. As $R^1$, a halogen atom is particularly preferably used.

Polymer A employed in the positive-working radiation-sensitive composition of the present invention can be obtained, for example, by replacing the hydrogen atoms of the acidic functional groups contained in aforesaid polymer B (the hydrogen atoms in the case where $R^2$ is hydrogen) by one or more type of acid labile group.

Examples of acid labile groups are the methoxymethyl group, methylthiomethyl group, ethoxymethyl group, ethylthiomethyl group, methoxyethoxymethyl, benzyloxymethyl group, benzylthiomethyl group, phenacyl group, bromophenacyl group, methoxyphenacyl group, methylthiophenacyl group, α-methylphenacyl, cyclopropylmethyl group, benzyl group, diphenylmethyl group, triphenylmethyl group, bromobenzyl group, nitrobenzyl group, methoxybenzyl group, methylthiobenzyl group, ethoxybenzyl group, methoxycarbonylmethyl group, ethoxycarbonylmethyl group, n-propoxycarbonylmethyl group, isopropoxycarbonylmethyl group, n-butoxycarbonylmethyl group, t-butoxycarbonylmethyl group, propenyl group, 1-methoxyethyl group, 1-methylthioethyl group, 1,1-dimethoxyethyl group, 1-ethoxyethyl group, 1-ethylthioethyl group, 1,1-diethoxyethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, 1-methoxycarbonylethyl group, 1-ethoxycarbonylethyl group, 1-n-propoxycarbonylethyl group, 1-isopropoxycarbonylethyl group, 1-n-butoxycarbonylethyl group, 1-t-butoxycarbonylethyl group, isopropyl group, s-butyl group, t-butyl group, 1,1-dimethylbutyl group, trimethylsilyl group, ethyldimethylsilyl group, methyldiethylsilyl group, triethylsilyl group, isopropyldimethylsilyl group, methyldiisopropylsilyl group, triisopropylsilyl group, t-butyldimethylsilyl group, methyldi-t-butylsilyl group, tri-t-butylsilyl group, phenyldimethylsilyl group, methyldiphenylsilyl group, triphenylsilyl group, methoxycarbonyl group, ethoxycarbonyl group, isopropoxycarbonyl group, t-butoxycarbonyl group, acetyl group, propionyl group, butyryl group, heptanoyl group, hexanoyl group, valeryl group, pivaloyl group, isovaleryl group, lauroyl group, myristoyl, group, palmitoyl group, stearoyl group, oxalyl group, malonyl group, succinyl group, glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluenesulphonyl group, mesyl group, cyclopropyl group, cyclopentyl group, cyclohexyl group, cyclohexenyl group, 4-methoxycyclohexyl group, tetrahydropyranyl group, tetrahydrofuranyl group, tetrahydrothiopyranyl group, tetrahydrothiofuranyl group, 3-bromotetrahydropyranyl group, 4-methoxytetrahydropyranyl group, 4-methoxytetrahydrothiopyranyl group, 3-tetrahydrothiophene-1,1-dioxide and the like. In particular, t-alkyl groups, 1-ethoxyalkyl groups and the tetrahydropyranyl group are favourably employed.

In the case where polymer A or B employed in the present invention contains monomer units B represented by general formula (1), or where the hydrogen atom in the acidic functional group (the hydrogen atom in the case where $R^2$ is a hydrogen atom) thereof has been replaced by an acid labile group (hereinafter referred to as monomer units A), said polymer may be composed only of such monomer units but, providing that the solubility characteristics of the particular polymer in aqueous alkali solution are not impaired and the ease of main chain scission lies in the range above that of polymethyl methacrylate, then the polymer may also be a copolymer containing other monomer units. Examples of other monomer structures are acrylic acid, methyl acrylate, ethyl acrylate, hydroxyethyl acrylate, isopropyl acrylate, n-butyl acrylate, t-butyl acrylate, methacrylic acid, methyl methacrylate, ethyl methacrylate, hydroxyethyl methacrylate, isopropyl methacrylate, n-butyl methacrylate, t-butyl methacrylate, methyl α-chloroacrylate, ethyl α-chloroacrylate, hydroxyethyl α-chloroacrylate, isopropyl α-chloroacrylate, n-butyl α-chloroacrylate, t-butyl α-chloroacrylate, 2,2,2-trifluoroethyl α-chloroacrylate, 2,2,3,3-tetrafluoropropyl α-chloroacrylate, methyl α-cyanoacrylate, ethyl α-cyanoacrylate, hydroxyethyl α-cyanoacrylate, isopropyl α-cyanoacrylate, n-butyl α-cyanoacrylate, styrene, p-hydroxystyrene, α-methylstyrene, α-methyl-p-hydroxystyrene, maleic acid, maleic anhydride, crotonic acid, fumaric acid, mesaconic acid, citraconic acid, itaconic acid, acrylonitrile, methacrylonitrile, crotononitrile, maleonitrile, fumaronitrile, metacononitrile, citracononitrile, itacononitrile, acrylamide, methacrylamide, crotonamide, maleamide, fumaramide, mesaconamide, citraconamide, itaconamide, vinyl aniline, vinyl pyrrolidone, vinyl imidazole and the like.

In the case where polymer A or B in the present invention contains monomer units other than monomer units A or B, the content of the monomer units A and/or B is preferably from 10 mol % to 100 mol %, and more preferably from 20 mol % to 100 mol %.

In polymer A of the present invention, the proportion of the hydrogen atoms in the acidic functional groups replaced by acid labile group is preferably from 5% to 100%, more preferably from 10% to 100%, and in particular from 20% to 100%.

The weight average molecular weight of polymer A or B in the present invention is from 5,000 to 1,500,000, more preferably from 10,000 to 1,000,000 and still more preferably 10,000 to 100,000, measured by GPC and based on polystyrene conversion.

The positive-working radiation-sensitive composition of the present invention contains an acid generating agent which generates acid by the irradiation of radiation. The acid generating agent employed here may be of any kind providing that it is possible to bring about elimination of the acid labile groups in the polymer by means of the acid generated. Onium salts, halogen-containing compounds, diazoketone compounds, diazomethane compounds, sulphone compounds, sulphonic acid ester compounds, sulphonimide compounds and the like can be cited as examples.

As specific examples of the onium salts, there are diazonium salts, ammonium salts, iodonium salts, sulphonium salts, phosphonium salts, oxonium salts and the like. As preferred onium salts, there are diphenyliodonium triflate, diphenyliodonium pyrene-sulphonate, diphenyliodonium dodecylbenzenesulphonate, triphenylsulphonium triflate, triphenylsulphonium hexafluoroantimonate, triphenylsulphonium naphthalene-sulphonate, (hydroxyphenyl)benzylmethylsulphonium toluenesulphonate and the like.

As specific examples of the halogen-containing compound, there are haloalkyl group-containing hydrocarbon compounds, haloalkyl group-containing heterocyclic compounds and the like. Preferred examples of the halogen-containing compounds are 1,1-bis(4-chlorophenyl)-2,2,2-trichloroethane, 2-phenyl-4,6-bis(trichloromethyl)-s-triazine and 2-naphthyl-4,6-bis(trichloromethyl)-s-triazine. As specific examples of the diazoketone compounds, there are 1,3-diketo-2-diazo compounds, diazobenzoquinone compounds, diazonaphthoquinone compounds and the like. Preferred examples of the diazoketone compounds are the ester of 1,2-naphthoquinonediazide-4-sulphonic acid and 2,2,3,4,4'-tetrahydroxybenzophenone, and the ester of 1,2-naphthoquinonediazide-4-sulphonic acid and 1,1,1-tris(4-hydroxyphenyl)ethane.

As specific examples of the diazomethane compound, there are bis(trifluoromethylsulphonyl)diazomethane, bis(cyclohexylsulphonyl)diazomethane, bis(phenylsulphonyl)diazomethane, bis(p-tolylsulphonyl)diazomethane, bis(2,4-xylylsulphonyl)diazomethane, bis(p-chlorophenylsulphonyl)diazomethane, methylsulphonyl-p-toluenesulphonyldiazomethane, cyclohexylsulphonyl(1,1-dimethylethylsulphonyl)diazomethane, bis(1,1-dimethylethylsulphonyl)diazomethane and phenylsulphonyl(benzoyl)diazomethane.

As specific examples of the sulphone compounds, there are β-ketosulphone compounds, β-sulphonylsulphone compounds and the like. Preferred examples are 4-trisphenacylsulphone, mesitylphenacylsulphone and bis(phenylsulphonyl)methane.

As examples of the sulphonic acid ester compounds, there are alkylsulphonic acid esters, haloalkylsulphonic acid esters, arylsulphonic acid esters, iminosulphonates and the like. As specific examples of sulphonic acid compounds, there are benzoin tosylate, pyrogallol trimesylate, nitrobenzyl-9,10-diethoxyanthracene-2-sulphonate and the like.

As specific examples of the sulphonimide compounds there are N-(trifluoromethylsulphonyloxy)succinimide, N-(trifluoromethylsulphonyloxy)phthalimide, N-(trifluoromethylsulphonyloxy)diphenylmaleimide, N-(trifluoromethylsulphonyloxy)bicyclo[2.2.1]hept-5-ene-2,3-dicarboxylimide, N-(trifluoromethylsulphonyloxy)-7-oxabicyclo[2.2.1]hept-5-ene-2,3-dicarboxylimide, N-(trifluoromethylsulphonyloxy)bicyclo-[2.2.1]heptan-5,6-oxy-2,3-dicarboxylimide, N-(trifluoromethylsulphonyloxy)naphthyldicarboxylimide, N-(camphanylsulphonyloxy)succinimide, N-(camphanylsulphonyloxy)phthalimide, N-(camphanylsulphonyloxy)diphenylmaleimide, N-(camphanylsulphonyloxy)bicyclo[2.2.1]hept-5-ene-2,3-dicarboxylimide, N-(camphanylsulphonyloxy)-7-oxabicyclo-[2.2.1]hept-5-ene-2,3-dicarboxylimide, N-(camphanylsulphonyloxy)bicyclo[2.2.1]heptan-5,6-oxy-2,3-dicarboxylimide, N-(camphanylsulphonyloxy)naphthyldicarboxylimide, N-(4-methylphenylsulphonyloxy)succinimide, N-(4-methylphenylsulphonyloxy)phthalimide, N-(4-methylphenylsulphonyloxy)diphenylmaleimide, N-(4-methylphenylsulphonyloxy)bicyclo-[2.2.1]hept-5-ene-2,3-dicarboxylimide, N-(4-methylphenylsulphonyloxy)-7-oxabicyclo[2.2.1]hept-5-en-2,3-dicarboxylimide, N-(4-methylphenylsulphonyloxy)bicyclo-[2.2.1]heptane-5,6-oxy-2,3-dicarboxylimide, N-(4-methylphenylsulphonyloxy)naphthyldicarboxylimide, N-(2-trifluoromethylphenylsulphonyloxy)succinimide, N-(2-trifluoromethylphenylsulphonyloxy)phthalimide, N-(2-trifluoromethylphenylsulphonyloxy)diphenylmaleimide, N-(2-trifluoromethylphenylsulphonyloxy)bicyclo[2.2.1]hept-5-en-2,3-dicarboxylimide, N-(2-trifluoromethylphenylsulphonyloxy)-7-oxabicyclo[2.2.1]hept-5-ene-2,3-dicarboxylimide, N-(2-trifluoromethylphenylsulphonyloxy)bicyclo[2.2.1]heptane-5,6-oxy-2,3-dicarboxyimide, N-(2-trifluoromethylphenylsulphonyloxy)naphthyldicarboxylimide, N-(4-fluorophenylsulphonyloxy)succinimide, N-(2-fluorophenylsulphonyloxy)phthalimide, N-(4-fluorophenylsulphonyloxy)diphenylmaleimide, N-(4-fluorophenylsulphonyloxy)bicyclo[2.2.1]hept-5-ene-2,3-dicarboxylimide, N-(4-fluorophenylsulphonyloxy)-7-oxabicyclo[2.2.1]hept-5-ene-2,3-dicarboxylimide, N-(4-fluorophenylsulphonyloxy)bicyclo[2.2.1]heptan-5,6-oxy-2,3-dicarboxylimide, N-(4-fluorophenylsulphonyloxy)naphthyldicarboxylimide and the like.

These acid generating agents may be used on their own or they may be used as mixtures of two or more types. The amount of acid generating agent added is normally from 0.01 to 50 wt % in terms of the polymer, more preferably from 0.1 to 10 wt %. If there is less than 0.01 wt %, then pattern forming becoming impossible, while with more than 50 wt % the affinity for the developer liquid drops and development faults are generated.

As the dissolution inhibitor C used along with the polymer B in the present invention, there can be employed, for example, a compound containing an acidic functional group such as phenolic hydroxide group, a carboxyl group or a sulphoxy group, where the hydrogen atom of said acidic functional group has been replaced by an acid labile group. As examples of the compound with an acidic functional group employed here, there are hydroquinone, catechol, bisphenol A, hydroxyphenyl-acetic acid and 4-hydroxybenzenesulphonic acid. As examples of the acid labile group, there can be cited the acid labile groups used in the aforesaid polymer the aqueous alkali solubility of which is increased by the action of acid. In particular, the 1-ethoxyethyl group, t-butyl group, t-butoxycarbonyl group and tetrahydropyranyl group are preferably used.

It is also possible to use a polymeric compound as the dissolution inhibitor C employed in the present invention. As a polymeric dissolution inhibitor, there may be employed a polymer with hydroxy or carboxyl groups, where the hydroxy or carboxyl groups are protected by means of an aforesaid acid labile group. As specific examples of polymers with hydroxyl or carboxyl groups there are the polymers of at least one type of monomer with a polymerizable double bond such as hydroxystyrene, α-methylhydroxystyrene, α-chlorohydroxystyrene, vinylbenzoic acid, carboxymethylstyrene, carboxymethoxystyrene, acrylic acid, methacrylic acid, crotonic acid, maleic acid, itaconic acid and cinnamic acid, and condensed polymers typified by novolac resins. As specific examples of the acid labile groups, there can be cited the acid labile groups employed in the aforesaid polymer the aqueous alkali solubility of which is increased by the action of acid.

The amount of the dissolution inhibitor C added is from 0 to 150 parts by weight, preferably from 5 to 100 parts by weight and more preferably 5 to 50 parts by weight per 100 parts by weight of the alkali-soluble polymer.

Optionally, surfactants, sensitising agents, stabilizers, antifoaming agents, acid diffusion inhibitors and the like can be added to the positive-working radiation-sensitive composition of the present invention.

The positive-working radiation-sensitive composition of the present invention is obtained by dissolving the aforesaid components in a solvent. There are no particular restrictions on the amount of solvent used, but preparation is performed such that the solids content is from 5 to 35 wt %. Preferred solvents -employed are a solvent or mixture of solvents selected from ethyl acetate, butyl acetate, amyl acetate, ethyl propionate, methyl butyrate, methyl benzoate, methyl lactate, ethyl lactate, ethyl pyruvate, methyl β-isobutyrate, methyl 3-methoxypropionate, ethyl 3-ethoxypropionate, γ-butyrolactone and other such esters, Methyl Cellosolve, Ethyl Cellosolve, Butyl Cellosolve and other such Cellosolves, Methyl Cellosolve Acetate, Ethyl Cellosolve Acetate, Butyl Cellosolve Acetate and other such Cellosolve esters, propylene glycol monomethyl ether acetate, propylene glycol monoethyl ether acetate and other such propylene glycol esters, 1,2-dimethoxyethane, 1,2-diethoxyethane, tetrahydrofuran, anisole and other such ethers, methyl ethyl ketone, methyl isobutyl ketone, methyl n-amyl ketone, cyclohexanone, isophorone and other such ketones, and dimethylformamide, dimethylacetamide, N-methylpyrrolidone, dimethylsulphoxide, sulfolane and other such non-protic polar solvents.

The positive-working radiation-sensitive composition of the present invention is applied onto the substrate undergoing processing, and dried, and ordinarily it is employed in the form of a thin film of film thickness from 0.2 μm to 2 μm. A fine pattern can be obtained by subjecting this thin film to pattern exposure using radiation such as electron beams, X-rays or the like, and then carrying out development. In particular, there is a great effect in the case of pattern exposure using electron beams or X-rays. The use of electron beams gives an especially marked effect.

The developing of the radiation sensitive composition of the present invention can be conducted using a known developer. As examples, there are aqueous solutions containing one or more inorganic alkali such as the hydroxide, carbonate, phosphate, silicate or borate of an alkali metal, an amine such as 2-diethylaminoethanol, monoethanolamine or diethanolamine, or a quaternary ammonium compound such as tetramethylammonium hydroxide or choline.

EXAMPLES

Below, the present invention is explained in still more specific terms by providing examples.

Synthesis Example 1

32 g of α-chloroacrylic acid was dissolved in 600 ml of dichloromethane and, to this, 20 ml of methanesulphonic acid and 300 ml of isobutylene were added at −5° C. After stirring for 30 hours at room temperature, the reaction liquid was poured into 500 ml of saturated aqueous sodium bicarbonate solution and the dichloromethane layer separated off. After drying with anhydrous sodium sulphate, the solvent was distilled off and t-butyl α-chloroacrylate obtained. 10 g of the t-butyl α-chloroacrylate obtained plus 200 mg of azobisisobutyronitrile were dissolved in 100 ml of toluene and reaction carried out at 80° C. Poly-t-butyl α-chloroacrylate was obtained. The molecular weight of the copolymer obtained determined by gel permeation chromatography (GPC) was, by polystyrene conversion, a number average molecular weight of 215,000 and a weight average molecular weight of 537,000. The polymer obtained was irradiated with an electron beam, and the value of the main chain scission efficiency Gs calculated from the number average molecular weight determined by GPC was 3.8.

Synthesis Example 2

11 g of α-chloroacrylic acid, 12 g of methyl α-chloroacrylate and 400 mg of azobisisobutyronitrile were dissolved in 200 ml of toluene, and reaction carried out at 80° C. Copolymer was obtained. The molecular weight of the copolymer obtained determined by gel permeation chromatography (GPC) was, by polystyrene conversion, a number average molecular weight of 270,000 and a weight average molecular weight of 756,000. The polymer obtained was irradiated with an electron beam, and the main chain scission efficiency Gs calculated from the number average molecular weight determined by GPC was 3.2.

Synthesis Example 3

10 g of t-butyl α-chloroacrylate obtained in the same way as in Synthesis Example 1 and 200 mg of azobisisobutyronitrile were dissolved in 100 ml of benzene, and polymerization carried out at 60° C. Poly-t-butyl α-chloroacrylate was obtained. The molecular weight of the polymer obtained determined by gel permeation chromatography (GPC) was, by polystyrene conversion, a number average molecular weight of 425000 and a weight average molecular weight of 1,130,000. The polymer obtained was irradiated with an electron beam, and the main chain scission efficiency Gs calculated from the number average molecular weight determined by GPC was 4.1.

Synthesis Example 4

10 g of t-butyl α-chloroacrylate obtained in the same way as in Synthesis Example 1, 60 mg of dodecanethiol and 200 mg of azobisisobutyronitrile were dissolved in 100 ml of toluene, and polymerization carried out at 80° C. Poly-t-butyl α-chloroacrylate was obtained. The molecular weight of the polymer obtained determined by gel permeation chromatography (GPC) was, by polystyrene conversion, a number average molecular weight of 16,300 and a weight average molecular weight of 58,600. The polymer obtained was irradiated with an electron beam, and the main chain scission efficiency Gs calculated from the number average molecular weight determined by GPC was 4.0.

Synthesis Example 5

11 g of α-chloroacrylic acid, 12 g of methyl α-chloroacrylate, 120 mg of dodecanethiol and 400 mg of azobisisobutyronitrile were dissolved in 200 ml of toluene, and reaction carried out at 80° C. Copolymer was obtained. The molecular weight of the copolymer obtained determined by gel permeation chromatography (GPC) was, by polystyrene conversion, a number average molecular weight of 22,000 and a weight average molecular weight of 82,000. The polymer obtained was irradiated with an electron beam, and the value of the main chain scission efficiency Gs calculated from the number average molecular weight determined by GPC was 3.5.

Synthesis Example 6

10 g of t-butyl methacrylate and 200 mg of azobisisobutyronitrile were dissolved in 100 ml of toluene, and reaction carried out at 80° C. Poly-t-butyl methacrylate was obtained. The molecular weight of the polymer obtained determined by gel permeation chromatography (GPC) was, by polystyrene conversion, a number average molecular weight of 264,000 and a weight average molecular weight of 713,000. The polymer obtained was irradiated with an electron beam, and the value of the main chain scission efficiency Gs calculated from the number average molecular weight determined by GPC was 2.3.

Synthesis Example 7

8.5 g of methacrylic acid, 10 g of methyl methacrylate and 400 mg of azobisisobutyronitrile were dissolved in 200 ml of toluene, and reaction carried out at 80° C. The molecular weight of the polymer obtained determined by gel permeation chromatography (GPC) was, by polystyrene conversion, a number average molecular weight of 610,000 and a weight average molecular weight of 1,530,000. The polymer obtained was irradiated with an electron beam, and the value of the main chain scission efficiency Gs calculated from the number average molecular weight determined by GPC was 1.3.

Synthesis Example 8

10 g of α-chloroacrylic acid and 7.1 g of ethyl vinyl ether were reacted together in dichloromethane for 4 hours at room temperature. After distilling off the solvent, 1-ethoxyethyl α-chloroacrylate was obtained. 10 g of the 1-ethoxyethyl α-chloroacrylate obtained and 200 mg of azobisisobutyronitrile were dissolved in 100 ml of benzene, and polymerization carried out at 60° C. Poly-1-ethoxyethyl α-chloroacrylate was obtained. The molecular weight of the polymer obtained determined by gel permeation chromatography (GPC) was, by polystyrene conversion, a number average molecular weight of 75,000 and a weight average molecular weight of 188,000. The polymer obtained was irradiated with an electron beam, and the value of the main chain scission efficiency Gs calculated from the number average molecular weight determined by GPC was 3.8.

Synthesis Example 9

41.6 g of phosphorus pentachloride was dispersed in 150 ml of ether and then, while stirring and cooling in an ice-water bath, there was added dropwise, from a dropping funnel, a solution of 17 g of cyanoacetic acid dissolved in 50 ml of ether. Directly after the completion of the dropwise addition, the ether and phosphorus oxychloride were driven off with an evaporator and 150 ml of tetrahydrofuran added to the residue. While stirring at 50° C., 15.6 g of t-butanol was added dropwise. Following the dropwise addition, the reaction was continued for 8 hours, after which the t-butyl cyanoacetate was obtained by distillation. A suspension of 19.8 g of the t-butyl cyanoacetate obtained, 110 ml of benzene, 4.2 g of paraformaldehyde, 1 g of piperidine hydrochloride and 1 g of glacial acetic acid was heated and water eliminated while refluxing. After water no longer was given off, the benzene was distilled off. The residue was cooled, after which it was dissolved in acetone and reprecipitated in water. The resinous material was collected by decanting, then redissolved in acetone and subjected to thermal decomposition and distillation under reduced pressure. t-Butyl α-cyanoacrylate was obtained. 5 g of the t-butyl α-cyanoacrylate obtained and 100 mg of azobisisobutyronitrile were dissolved in 50 ml of tetrahydrofuran, and polymerization carried out at 60° C. Poly-t-butyl α-cyanoacrylate was obtained. The molecular weight of the polymer obtained determined by gel permeation chromatography (GPC) was, by polystyrene conversion, a number average molecular weight of 32,000 and a weight average molecular weight of 98,000. The polymer obtained was irradiated with an electron beam, and the value of the main chain scission efficiency Gs calculated from the number average molecular weight determined by GPC was 3.8.

Synthesis Example 10

45.3 g of α-bromoacrylic acid, 30 g of 2,3-dihydro-2H-pyran and 0.1 g of p-toluenesulphonic acid were dissolved in 300 ml of dichloromethane, and stirring carried out for 4 hours at room temperature. The reaction solution was washed with aqueous sodium bicarbonate solution, the dichloromethane distilled off and tetrahydropyranyl α-bromoacrylate obtained. 10 g of the tetrahydropyranyl α-bromoacrylate obtained and 200 mg of azobisisobutyronitrile were dissolved in 100 ml of toluene, and reaction carried out at 80° C. Polytetrahydropyranyl α-bromoacrylate was obtained. The molecular weight of the polymer obtained determined by gel permeation chromatography (GPC) was, by polystyrene conversion, a number average molecular weight of 88,000 and a weight average molecular weight of 237,000. The polymer obtained was irradiated with an electron beam, and the value of the main chain scission efficiency Gs calculated from the number average molecular weight determined by GPC was 3.6.

Example 1

5 g of the poly-t-butyl α-chloroacrylate obtained in Synthesis Example 1 and 100 mg of triphenylsulphonium triflate were dissolved in ethyl lactate, filtered with a 0.1 μm filter and a resist composition obtained. The resist composition obtained was spin-coated onto a silicon wafer, after which heating was carried out for 3 minutes at 100° C., and a resist film of film thickness 1.0 μm obtained. Using an electron beam exposure device, this resist film was subjected to electron beam irradiation in a pattern shape at an acceleration voltage of 20 kV. After heating for 1.5 minutes at 100° C., developing was carried out with tetramethylammonium hydroxide. A 0.15 μm pattern was obtained at an exposure dose of 1.0 μC/cm$^2$.

Comparative Example 2

A resist film was obtained on a silicon wafer in the same way as in Example 1. This resist film was exposed using a KrF eximer laser stepper, and then heated for 1.5 minutes at 100° C., after which developing was carried out with tetramethylammonium hydroxide. A 0.20 μm pattern was obtained at an exposure dose of 20 mJ/cm$^2$.

Example 3

5 g of the copolymer of α-chloroacrylic acid and methyl α-chloroacrylate obtained in Synthesis Example 2, 2 g of 1,4-bis(t-butoxycarbonyloxy)benzene as a dissolution inhibitor, and 100 mg of triphenylsulphonium triflate were dissolved in ethyl lactate, filtered with a 0.1 μm filter, and a resist composition obtained. After spin-coating the resist composition obtained onto a silicon wafer, heating was carried out for 3 minutes at 100° C. and a resist film of film thickness 1.0 μm obtained. Using an electron beam exposure device, this resist film was subjected to electron beam irradiation in a pattern shape at an acceleration voltage of 20 kV. After heating for 1.5 minutes at 100° C., developing was carried out with tetramethylammonium hydroxide. A 0.15 μm pattern was obtained at an exposure dose of 1.0 μC/cm$^2$.

Example 4

5 g of the poly-t-butyl. α-chloroacrylate obtained in Synthesis Example 3 and 250 mg of triphenylsulphonium triflate were dissolved in ethyl lactate, then filtered with a 0.1 µm filter and a resist composition obtained. The resist composition obtained was subjected to electron beam exposure and development in the same way as in Example 1. A 0.25 µm pattern was obtained at an exposure dose of 5.5 µC/cm$^2$.

Example 5

5 g of the poly-t-butyl α-chloroacrylate obtained in Synthesis Example 4 and 250 mg of triphenylsulphonium triflate were dissolved in ethyl lactate, then filtered with a 0.1 µm filter and a resist composition obtained. The resist composition obtained was subjected to electron beam exposure and development in the same way as in Example 1. A 0.15 µm pattern was obtained at an exposure dose of 0.7 µC/cm$^2$.

Example 6

A resist composition was obtained, electron beam exposure conducted and developing performed in the same way as in Example 3, excepting that there was used the copolymer of α-chloroacrylic acid and methyl α-chloroacrylate obtained in Synthesis Example 5. A 0.15 µm pattern was obtained at an exposure dose of 0.8 µC/cm$^2$.

Example 7

5 g of the poly-1-ethoxyethyl α-chloroacrylate obtained in Synthesis Example 8 and 100 mg of pyrogallol trimesylate were dissolved in propylene glycol monomethyl ether acetate, then filtration carried out with a 0.1 µm filter and a resist composition obtained. The resist composition obtained was subjected to electron beam exposure and development in the same way as in Example 1. A 0.25 µm pattern was obtained at an exposure dose of 1.0 µC/cm$^2$.

Example 8

2 g of the poly-t-butyl α-cyanoacrylate obtained in Synthesis Example 9 and 100 mg of diphenyliodonium triflate were dissolved in ethyl lactate, then filtration carried out with a 0.1 µm filter and a resist composition obtained. The resist composition obtained was subjected to electron beam exposure and development in the same way as in Example 1. A 0.25 µm pattern was obtained at an exposure dose of 6.0 µC/cm$^2$.

Example 9

5 g of the polytetrahydropyranyl α-bromoacrylate obtained in Synthesis Example 10 and 250 mg of N-(4-methylphenylsulphonyloxy)phthalimide were dissolved in ethyl lactate, then filtration carried out with a 0.1 µm filter and a resist composition obtained. The resist composition obtained was subjected to electron beam exposure and development in the same way as in Example 1. A 0.25 µm pattern was obtained at an exposure dose of 1.5 µC/cm$^2$.

Comparative Example 1

A resist film was obtained, electron beam exposure carried out and developing performed in the same way as in Example 1, excepting that there was used the poly-t-butyl methacrylate obtained in Synthesis Example 6 instead of the poly-t-butyl α-chloroacrylate employed in Example 1. Only a 0.40 µm pattern was obtained at an exposure dose of 8.0 µC/cm$^2$. In terms of sensitivity and resolution, adequate properties were not obtained.

Comparative Example 2

A resist film was obtained in the same way as in Example 3 excepting that there was used the copolymer of methacrylic acid and methyl methacrylate obtained in Synthesis Example 7 instead of the copolymer obtained in Synthesis Example 2, after which electron beam exposure was carried out and developing performed in the same way as in Example 1. Only a 0.45 µm pattern was obtained at an exposure dose of 8.5 µC/cm$^2$. In terms of sensitivity and resolution, adequate properties were not obtained.

Comparative Example 3

A resist film was obtained on a silicon wafer in the same way as in Example 1, excepting that there was used the poly-t-butyl methacrylate obtained in Synthesis Example 6 instead on the poly-t-butyl α-chloroacrylate. This resist film was exposed using a KrF eximer laser stepper and, after heating for 1.5 minutes at 100° C., developing was performed with tetramethylammonium hydroxide. Only a 0.6 µm pattern was obtained at an exposure dose of 45 mJ/cm$^2$. In terms of sensitivity and resolution, adequate properties were not obtained.

Industrial Application Potential

By employing, in the positive-working radiation-sensitive composition of the present invention, a polymer which readily undergoes main chain scission by irradiation with radiation as the binder resin of a chemically amplified resist, it is possible to obtain a composition of high resolution and high sensitivity.

TABLE 1

| | Polymer | | | | | Development Properties | |
|---|---|---|---|---|---|---|---|
| | Composition | | Mn | Mw | Gs | Exposure | Pattern (µm) |
| Example 1 | poly-t-butyl α-chloroacrylate | | 215000 | 537000 | 3.8 | 1.0 µC/cm$^2$ | 0.15 |
| Example 2 | poly-t-butyl α-chloroacrylate | | 215000 | 537000 | 3.8 | 20 µJ/cm$^2$ | 0.20 |
| Example 3 | α-chloroacrylic acid/methyl α-chloroacrylate (11/12 by weight) | | 270000 | 756000 | 3.2 | 1.0 µC/cm$^2$ | 0.15 |
| Example 4 | poly-t-butyl α-chloroacrylate | | 425000 | 1130000 | 4.1 | 5.5 µC/cm$^2$ | 0.25 |
| Example 5 | poly-t-butyl α-chloroacrylate α-chloroacrylic acid/methyl α- | | 16300 | 58600 | 4.0 | 0.7 µC/cm$^2$ | 0.15 |

TABLE 1-continued

| | Polymer | | | | Development Properties | |
|---|---|---|---|---|---|---|
| | Composition | Mn | Mw | Gs | Exposure | Pattern ($\mu$m) |
| Example 6 | chloroacrylate (11/12 by weight) | 22000 | 82000 | 3.5 | 0.8 $\mu$C/cm$^2$ | 0.15 |
| Example 7 | poly-1-ethoxyethyl $\alpha$-chloroacrylate | 75000 | 188000 | 3.8 | 1.0 $\mu$C/cm$^2$ | 0.25 |
| Example 8 | poly-t-butyl $\alpha$-cyanoacrylate | 32000 | 98000 | 2.8 | 6.0 $\mu$C/cm$^2$ | 0.25 |
| Example 9 | polytetrahydropyranyl $\alpha$-bromoacrylate | 88000 | 237000 | 3.6 | 1.5 $\mu$C/cm$^2$ | 0.25 |
| Comp. Ex. 1 | poly-t-butyl methacrylate | 264000 | 713000 | 2.3 | 8.0 $\mu$C/cm$^2$ | 0.4 |
| Comp. Ex. 2 | methacrylic acid/methyl methacrylate (8.5/10 by weight) | 610000 | 1530000 | 1.3 | 8.5 $\mu$C/cm$^2$ | 0.45 |
| Comp. Ex. 3 | poly-t-butyl methacrylate | 264000 | 713000 | 2.3 | 45 mJ/cm$^2$ | 0.6 |

What is claimed is:

1. A method of pattern formation on a substrate, comprising:
   coating on the substrate a positive-working composition sensitive to electron beams or X-rays, comprising one or the other, or both, of the following components (1) and (2):
   (1) a polymer A, the solubility of which is increased in aqueous alkali solution by the action of acid,
   (2) an alkali-soluble polymer B and a compound C which has the effect of suppressing the alkali solubility of said polymer B and the suppression effect of which is lowered or eliminated by the action of acid, and
   further comprising a component (3), which is a compound which generates acid by irradiation with electron beams or X-rays,
   wherein the ease of main chain scission of said polymer A or B by electron beams or X-rays is greater than that of polymethyl methacrylate;
   drying the coated composition;
   subjecting the dried composition to a pattern exposure using electron beams or X-rays;
   developing the exposed composition to form the pattern on the substrate.

2. A positive-working composition sensitive to electron beams or X-rays according to claim 1, wherein the positive-working composition comprises polymer A.

3. A method of pattern formation on a substrate according to claim 1, wherein the positive-working composition comprises polymer B and compound C.

4. A method of pattern formation on a substrate according to claim 1, wherein the value of the main chain scission efficiency Gs of polymer A or polymer B by radiation is at least 2.5.

5. A method of pattern formation on a substrate according to claim 2, wherein the value of the main chain scission efficiency Gs of polymer A or polymer B by radiation is at least 3.0 to 50.

6. A method of pattern formation on a substrate according to claim 1, wherein, in polymer A or B, the content of monomer units A or B represented by the following general formula is at least 10 mol %:

$$-\!\!\left[\text{CH}_2-\underset{\underset{\text{COOR}^2}{|}}{\overset{\overset{R^1}{|}}{C}}\right]\!\!-$$

wherein $R^1$ represents a halogen atom or cyano group, in monomer units of polymer B, $R^2$ is a hydrogen atom or a $C_2$ to $C_{12}$ organic group which has an acidic functional group, and in monomer units of polymer A, $R^2$ represents an acid labile group or an organic group with an acidic functional group where the hydrogen atom thereof is replaced by one or more acid labile groups.

7. A method of pattern formation on a substrate according to claim 6, wherein $R^1$ in the monomer units of polymer A or B is a halogen.

8. A method of pattern formation on a substrate according to claim 6, wherein the acid labile group of the monomer units of polymer A is selected from the group consisting of tertiary alkyl groups, 1-alkoxyalkyl groups and a tetrahydropyranyl group.

9. A method of pattern formation on a substrate according to claim 3, wherein compound C is a compound selected from the group consisting of hydroquinone, catechol, bisphenol A, hydroxyphenylacetic acid and 4-hydroxybenzenesulphonic acid, the hydrogen atoms of the acidic functional group of which has been replaced by an acid labile group selected from the group consisting of an 1-ethoxyethyl group, a t-butyl group, a t-butoxycarbonyl group and a tetrahydropyranyl group.

10. A method of pattern formation on a substrate according to claim 3, wherein, in polymer A or B, the content of monomer units A or B is at least 20 mol %.

11. A method of pattern formation on a substrate according to claim 1, wherein the weight average molecular weight of polymer A or polymer B is from 5,000 to 1,500,000 measured by GPC, based on polystyrene conversion.

12. A method of pattern formation on a substrate according to claim 11, wherein the weight average molecular weight of polymer A or polymer B is from 10,000 to 1,000,000 measured by GPC, based on polystyrene conversion.

13. A method of pattern formation on a substrate according to claim 12, wherein the weight average molecular weight of polymer A or polymer B is from 10,000 to 100,000 measured by GPC, based on polystyrene conversion.

* * * * *